(12) United States Patent
Musalgaonkar et al.

(10) Patent No.: US 12,080,756 B2
(45) Date of Patent: Sep. 3, 2024

(54) ALTERING BREAKDOWN VOLTAGES IN GATE DEVICES AND RELATED METHODS AND SYSTEMS

(71) Applicant: Micron Technology, Inc., Boise, ID (US)

(72) Inventors: Gaurav Musalgaonkar, Telangana (IN); Naveen Kaushik, Boise, ID (US); Sonam Jain, Telangana (IN); Haitao Liu, Boise, ID (US); Chittoor Ranganathan Parthasarathy, Telangana (IN)

(73) Assignee: Micron Technology, Inc., Boise, ID (US)

( * ) Notice: Subject to any disclaimer, the term of this patent is extended or adjusted under 35 U.S.C. 154(b) by 337 days.

(21) Appl. No.: 17/647,912

(22) Filed: Jan. 13, 2022

(65) Prior Publication Data

US 2023/0223434 A1 Jul. 13, 2023

(51) Int. Cl.
| | |
|---|---|
| *H01L 29/06* | (2006.01) |
| *H01L 27/088* | (2006.01) |
| *H01L 29/66* | (2006.01) |
| *H01L 29/78* | (2006.01) |

(52) U.S. Cl.
CPC ........ *H01L 29/0626* (2013.01); *H01L 27/088* (2013.01); *H01L 29/66681* (2013.01); *H01L 29/7816* (2013.01)

(58) Field of Classification Search
CPC ............... H01L 29/0626; H01L 27/088; H01L 29/66681; H01L 29/7816; H01L 21/823814; H01L 21/823418; H01L 27/092; H01L 29/0646; H01L 29/1083; H01L 29/7833; H01L 29/0611; H01L 29/4232; H01L 29/42364
See application file for complete search history.

(56) References Cited

U.S. PATENT DOCUMENTS

| | | | |
|---|---|---|---|
| 2015/0295081 A1* | 10/2015 | Matsuda | H01L 29/063 257/339 |
| 2021/0074811 A1 | 3/2021 | Watanabe et al. | |
| 2022/0093798 A1* | 3/2022 | Chiu | H01L 29/165 |

\* cited by examiner

*Primary Examiner* — Mohammed R Alam
(74) *Attorney, Agent, or Firm* — TraskBritt (57) ABSTRACT

An apparatus includes lightly doped drain regions vertically extending into a semiconductor substrate. A channel region is horizontally interposed between the lightly doped drain regions, and source/drain regions vertically extend into the lightly doped drain regions. Breakdown-enhancement implant intrusion regions are within the lightly doped drain regions and are horizontally interposed between the channel region and the source/drain regions. The breakdown enhancement implant regions have a different chemical species than the lightly doped drain regions and have upper boundaries vertically underlying upper boundaries of the lightly doped drain regions. The apparatus also has a gate structure vertically overlying the channel regions and it is horizontally interposed between the breakdown-enhancement implant regions. Memory devices, electronic systems, and methods of forming microelectronic devices are also described.

18 Claims, 7 Drawing Sheets

ALTERING BREAKDOWN VOLTAGES IN GATE DEVICES AND RELATED METHODS AND SYSTEMS

TECHNICAL FIELD

Integrated-circuit devices include breakdown-voltage configured regions for high-voltage devices.

BACKGROUND

As dimensions decrease as part of integrated-circuit miniaturization, useful breakdown voltages are affected by decreased dimensions such as gate lengths in semiconductor devices.

DETAILED DESCRIPTION

Integrated-circuit devices include "not and" (NAND) N-doped metal-oxide semiconductor (NMOS) structures where the breakdown voltage (BV) is altered within gated, lightly doped drain (GLDD) structures. The BV is altered by implant intrusion regions in well regions of the GLDD structures. For a lightly doped drain (LDD) structure with a P-doped substrate (Psub) that has an upper surface, LDD N− wells define a channel between the LDD N− wells, in the Psub, and N+ source/drain (S/D) contact regions extend into the LDD N− wells from the upper surface. Breakdown-enhancement implant (BEI) intrusions are located within the LDDs and each BEI intrusion is spaced apart from the channel in a fashion that adjusts the BV of the gate in response to miniaturization. For example, in a Psub with N− LDD regions, a P− BEI intrusion adjusts the BV for the adjacent channel. Where the BV is increased with a disclosed BEI intrusion, a punch-through (PT) current is also reduced at miniaturized gate lengths. This high-voltage (HV) NMOS device may be referred to as a HVN device.

Similarly, integrated circuit devices include NAND P-doped MOS (PMOS) structures where the BV is altered within GLDD structures. Accordingly, for an LDD structure within an N-doped substrate (Nsub) with an upper surface, LDD P− wells define a channel between the LDD P− wells, in the Nsub, and P+ S/D contact regions extend into the LDD P− wells from the upper surface. A BEI intrusion is located within the LDDs and each BEI intrusion is spaced apart from the channel in a fashion that adjusts the BV of the gate in response to miniaturization. For example, in an Nsub with P− LDD regions, an N− BEI intrusion adjusts the BV for the adjacent channel. Where the BV is increased with a disclosed BEI intrusion, a PT current is also reduced at miniaturized gate lengths. This HV PMOS device may be referred to as a HVP device.

The following description provides specific details, such as material compositions and processing conditions, in order to provide a useful description of embodiments of the disclosure. However, a person of ordinary skill in the art would understand that the embodiments of the disclosure may be practiced without employing these specific details. Embodiments of the disclosure may be practiced with known semiconductor fabrication techniques employed in the semiconductor industry. In addition, the description does not form a complete process flow for manufacturing an integrated-circuit device (e.g., a memory device). The structures described do not form complete integrated-circuit devices, such as microelectronic devices. Only those process stages (e.g., acts) and structures necessary to understand the embodiments of the disclosure are described in detail. Additional stages to form a complete integrated-circuit device may be performed by conventional fabrication techniques.

The materials described herein may be formed by known techniques including, but not limited to, spin coating. They may be formed by blanket coating. They may be formed by chemical vapor deposition (CVD). They may be formed by atomic layer deposition (ALD). They may be formed by plasma-enhanced ALD. They may be formed by physical vapor deposition (PVD). They may be formed by ion implantation such are reactive ion implantation (REI). The materials may be grown such as an epitaxial semiconductor layer on a semiconductor substrate. The materials may be grown such as an oxidation layer on a semiconductor material. Depending on the specific material to be formed, the technique for depositing or growing the material may be selected by a person of ordinary skill in the art. The removal of materials may be accomplished by any suitable technique including, but not limited to etching. The removal of materials may be done by abrasive planarization such as mechanical planarization. The removal of materials may be done by abrasive planarization such as chemical-mechanical planarization (CMP). The removal of materials may be done by other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. This means embodiments described herein are not to be construed as being limited to the particular shapes or regions as illustrated, but include deviations in shapes that result, for example, from fabrication techniques. For example, a region illustrated or described as box-shaped may have rough and/or nonlinear features characteristic of the process(es) used during fabrication. Also, a region illustrated or described as round may include some rough and/or linear features. Moreover, sharp angles that are illustrated may be rounded, and vice versa. This means the regions illustrated in the figures are schematic in nature, and their shapes are not intended to illustrate the precise shape of a region and do not limit the scope of the present claims. The drawings are not necessarily to scale. Additionally, elements common or analogous between figures may retain the same numerical designation.

As used herein, the singular forms "a," "an" and "the" are intended to include the plural forms as well, unless the context indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. The term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by a gravitational field. A "horizontal" or "lateral" direction is a direction that is substantially parallel to the major plane of the structure, while a "vertical" or "longitudinal" direction is a direction that is substantially orthogonal to the major plane of the structure. The major plane of the structure is defined by a surface of the structure having a relatively large region compared to other surfaces of the structure. As used herein, "proximal" and "distal" refer to relative distances from called-out structures or features.

As used herein, the term "configured" refers to a size, shape, material composition, orientation, and arrangement of one or more of at least one structure and at least one apparatus facilitating operation of one or more of the structure and the apparatus in a pre-determined way.

As used herein, reference to an element as being "above" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "above and on" or "directly adjacent to" another element, there are no intervening elements present for at least a portion of the two described elements.

As used herein, the term "critical dimension" refers to dimensions of the smallest geometrical features (e.g., a width of interconnect lines, contacts, trenches, etc.).

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated device" where distinct integrated-circuit components are associated to produce the higher function such as an SoC, including a processor alone, a memory alone, a processor and a memory, or an integrated-circuit device including logic and memory.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate. The substrate may be a base semiconductor material on a supporting structure, a metal electrode, or a semiconductor substrate having one or more materials, layers, structures, or regions formed thereon. The materials on the semiconductor substrate may include, but are not limited to, semiconductor materials, insulating materials, conductive materials, etc. The substrate may be a conventional silicon substrate or other bulk substrate comprising a layer of semiconductor material. As used herein, the term "bulk substrate" means and includes not only silicon wafers, but also silicon-on-insulator ("SOI") substrates. The "bulk substrate" may mean SOI substrates such as silicon-on-sapphire ("SOS") substrates. The "bulk substrate" may mean SOI substrates such as silicon-on-glass ("SOG") substrates. The "bulk substrate" may mean epitaxial layers of silicon on a base semiconductor foundation. The "bulk substrate" may mean other semiconductor or optoelectronic materials. The semiconductor or optoelectronic materials may mean silicon-germanium containing materials. The semiconductor or optoelectronic materials may mean germanium containing materials. The semiconductor or optoelectronic materials may mean silicon-carbide containing materials. The semiconductor or optoelectronic materials may mean germanium-containing materials. The semiconductor or optoelectronic materials may mean gallium arsenide-containing materials. The semiconductor or optoelectronic materials may mean gallium nitride-containing materials. The semiconductor or optoelectronic materials may mean indium phosphide-containing materials. The substrate may be doped or undoped.

As used herein, the term "mounting substrate" means and includes structures that are configured to accept an integrated-circuit device. The mounting substrate may be a package board that directly contacts an integrated circuit device such as a bare die containing a central-processing unit. The package board may be mounted on a printed wiring board (PWB). The mounting substrate may be a printed wiring board onto which at least one integrated circuit device and/or package board are mounted. The mounting substrate may include a disaggregated device.

As used herein, "lightly doped," in reference to a region, such as a well for an opposite-doped substrate means and includes a dopant chemical species concentration (e.g., N– concentration, P– concentration) within a range of from about $1e^{16}$ units of the dopant chemical species per cubic centimeter ($cm^3$) to about $5e^{19}$ units of the dopant species per $cm^3$, such as from about $5e^{16}$ units of the dopant chemical species per $cm^3$ to about $5e^{17}$ units of the dopant species per $cm^3$.

Disclosed examples relate to breakdown-enhanced implant (BEI) intrusion, gated, lightly doped drain (GLDD) structures that include a lightly doped drain (LDD) region. For example, an N– LDD region surrounds a source/drain (S/D) region of the transistor. The S/D region may also be referred to as an S/D contact region. The S/D region vertically extends into the N– LDD region from an upper boundary (e.g., an upper surface) of the N– LDD region. The BEI intrusion, GLDD structures include P– breakdown-enhancement implant (BEI) intrusions in each of the N– LDD regions. The P– BEI intrusions are each spaced apart from the channel, and are each closer to the channel than is each corresponding N+ S/D region. Also, each P– BEI intrusion has an upper boundary that is below the upper boundary of each corresponding N– LDD region. Thus, a GLDD structure includes, for example, a P-doped substrate (Psub) with N– LDD regions that define a channel, a P– BEI intrusion in each LDD region, N+ S/D regions in each N– LDD region and a gate-select structure above the channel. Similarly, disclosed examples may be applied to an N-doped (Nsub) substrate with P– LDD regions and P+ S/D regions, wherein the P– BEI intrusions described in further detail herein are instead N– BEI intrusions. Disclosed examples and techniques improve the scalability of high-voltage (HV) devices (e.g., HV NMOS transistors) without degrading the breakdown voltage (BV) that otherwise is experienced as a result of miniaturization. Similarly, disclosed examples and techniques improve the scalability of string-driver devices (e.g., string driver transistors) without degrading the BV that otherwise is experienced as a result of miniaturization.

As used herein, a high voltage (HV) transistor, such as a HV NMOS ("HVN") transistor, means an N-channel in a high-voltage NMOS BEI intrusion device. An HV PMOS ("HVP") transistor, means a P-channel in a high-voltage PMOS BEI intrusion device. In each type of HV BEI intrusion device, it includes a transistor that functions in a BV range of from about 15V to about 45V, for example, depending upon channel length and other operating parameters. Conversely, as used herein, a low voltage (LV) transistor, such as a LV NMOS transistor or a LV PMOS transistor means and includes a transistor that functions in a BV range of from about 3 V to about 10 V.

Although disclosed examples refer to an HVN NAND device, the disclosed illustrations may be applied to other gated structures where an altered BV may be employed. Other gated structures include high-voltage P-gated (HVP) NAND devices within an Nsub, with breakdown-voltage altering N– BEI intrusions in each corresponding P– LDD region. Other gated structures include low-voltage N-gated (LVN) devices in a Psub, with a breakdown-voltage-altering P– BEI intrusion in each corresponding N– LDD region. Other gated structures include low-voltage P-gated (LVP) devices with an Nsub, with a breakdown-voltage-altering N– BEI intrusion in each corresponding P– LDD region.

In disclosed examples, a relatively miniaturized geometry that otherwise would have experienced a lowered BV, experiences an increased BV for useful applications. The structure of the LDD region uses an intrusion (e.g., region, section, pocket) of a BEI intrusion material within the LDD region near to, but spaced apart from the channel. In an embodiment, the BEI intrusion raises the BV to make for example, an NMOS device useful compared to previously larger geometries. Consequently if a reduced channel length ($L_{CH}$) would otherwise decrease the BV, the BEI intrusions of the disclosure may facilitate relatively increased BVs. Conventionally, BVs may, for example, be increased as $L_{CH}$ is reduced (e.g., miniaturized) from about 1.3 micrometer (μm) to about 0.8 μm, such that a BV of about 24 Volt (V) at a 1.3 μm $L_{CH}$, may be reduced to a BV of about 6 V at a 0.8 μm $L_{CH}$. However, BEI intrusions of the disclosure may, for example, facilitate a BV of about 34 V at a 1.3 μm $L_{CH}$, and a BV of about 31 V at a 0.8 μm $L_{CH}$. Other useful alterations in BV are disclosed with reduced channel lengths.

The BEI intrusions of the disclosure also facilitate changes in peak electrical field distributions, at an interface of boundaries of the LDD region and a gate structure such as where the LDD region meets a Psub channel and a gate dielectric. The changes may, for example, facilitate electrical field peak distributions that are lowered by about 18% at the gate dielectric interface, by about 34% below 10 nanometer (nm), and by about 16% at below 50 nm. Also, with the BEI intrusions in the LDD regions, the location of the electric field distribution peak is closer to the interface of the boundaries of the LDD region and the gate structure. By comparison without BEI intrusions of the disclosure within the LDD region, the electrical field distribution peak may be about 1 μm from the gate edge, whereas with the BEI intrusion of the disclosure, the electrical field distribution peak may be about 0.8 μm from the interface of the boundaries of the LDD region and the gate structure.

Figure 1A:
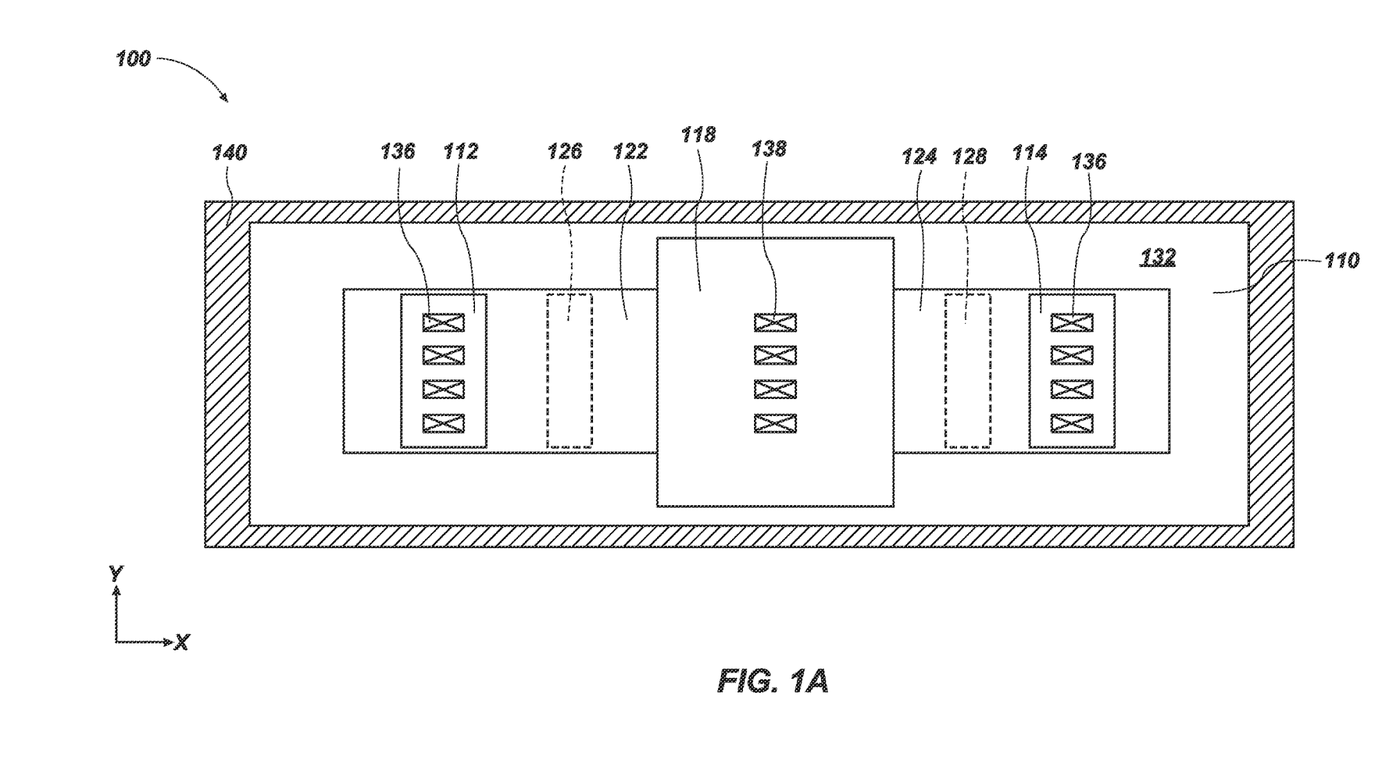
FIG. 1A is a top plan view and FIG. 1B is a cross-section elevation view of a gated, lightly doped drain device in accordance with embodiments of this disclosure.
Figure 1B:
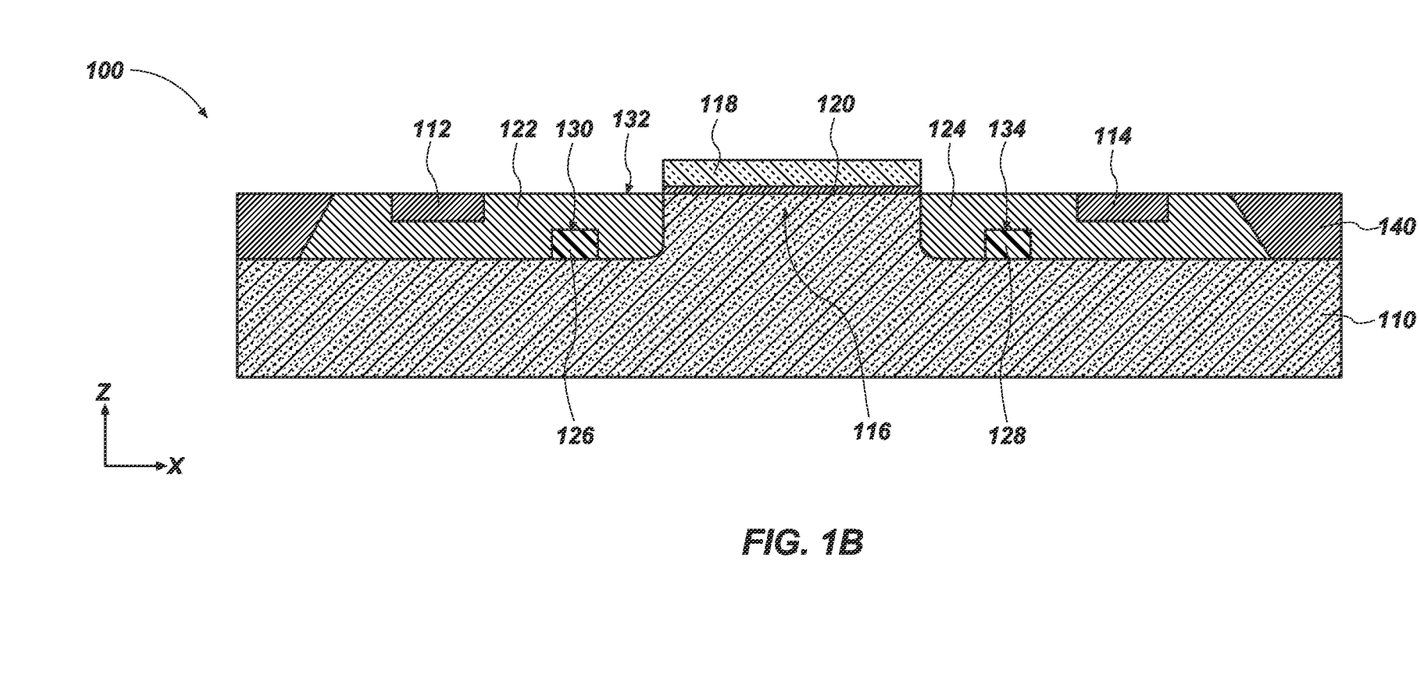

FIG. 1A is a top plan view and FIG. 1B is a cross-section elevation view of a BEI intrusion gated, lightly doped drain (GLDD) device 100 (e.g., a transistor, such as an NMOS transistor or a PMOS transistor), in accordance with embodiments of the disclosure. As collectively depicted in FIGS. 1A and 1B, the BEI intrusion GLDD device 100 may be formed in a semiconductor substrate 110 to include a first source/drain (S/D) region 112; a second S/D region 114 horizontally offset from the first source/drain (S/D) region 112; a channel region 116 horizontally interposed between the first S/D region 112 and the second S/D region 114; and a gate structure 118 vertically overlying and horizontally overlapping the channel region 116. A gate dielectric material 120 is interposed between the gate structure 118 and the channel region 116. The GLDD device 100 further includes a first LDD region 122 surrounding the first S/D region 112 and horizontally interposed between the first S/D region 112 and the channel region 116; and a second LDD region 124 surrounding the second S/D region 114 and horizontally interposed between the second S/D region 114 and the channel region 116. In addition, the BEI intrusion device 100 includes a first BEI intrusion 126 (e.g., pocket, region, section) vertically extending into the first LDD region 122 and horizontally interposed between the first S/D region 112 and the channel region 116; and a second BEI intrusion 128 vertically extending into the second LDD region 124 and horizontally interposed between the second S/D region 114 and the channel region 116. The foregoing features of the BEI intrusion device 100 are described in further detail below.

The first S/D region 112, the second S/D region 114, the channel region 116, the first LDD region 122, the second LDD region 124, the first BEI intrusion 126, and the second BEI intrusion 128 of the BEI intrusion device 100 may each be formed within the semiconductor substrate 110 (e.g., a semiconductor wafer). In some embodiments, the semiconductor substrate 110 has a P-doped (Psub) configuration; the first S/D region 112 and the second S/D region 114 are each N+ doped; and the first LDD region 122 and the second LDD region 124 are each N− doped.

The first BEI intrusion 126 may extend from a Psub region of the semiconductor substrate 110, and partially into the first LDD region 122. An upper boundary 130 of the first BEI intrusion 126 may vertically underlie an upper surface 132 of the semiconductor substrate 110 (and, hence, the upper surface 132 is an upper boundary of the first LDD region 122). The upper boundary 130 may be referred to as an "upper vertical boundary" 130, when viewed with the illustrated orientation in FIG. 1B, where the Z-axis indicates a vertical direction. The second BEI intrusion 128 may extend from the Psub region of the semiconductor substrate 110, and partially into the second LDD region 124. An upper boundary 134 of the second BEI intrusion 128 may vertically underlie the upper surface 132 (and, hence, an upper boundary of the second LDD region 124). The first BEI intrusion 126 and the second BEI intrusion 128 are depicted with dashed lead-lines in FIG. 1A as the BEI intrusions 126 and 128 are covered by portions of the first LDD region 122 and the second LDD region 124, respectively.

The gate structure 118 (e.g., gate electrode) of the BEI intrusion device 100 is formed of and includes conductive material (e.g., conductively doped polysilicon), and the gate dielectric material 120 interposed between the gate structure 118 and the channel region 116 is formed of and includes insulative material (e.g., $SiO_2$). The BEI intrusion device 100 may be part of an array of BEI intrusion devices and they may be collectively adjacent or individually isolated such as with a shallow-trench isolation (STI) 140 structure. As shown in FIG. 1A, one or more S/D conductive contacts 136 may individually be provided in contact (e.g., electrical contact, physical contact) with one of the first S/D region 112 and the second S/D region 114. Furthermore, an additional conductive contact 138 may be provided in contact (e.g., electrical contact, physical contact) with the gate structure 118.

If the first LDD region 122 and the second LDD region 124 are N− doped (e.g., doped with one or more N-type dopants), the first BEI intrusion 126 and the second BEI intrusion 128 may each be P− doped (e.g., doped with one or more P-type dopants). For example, the first BEI intrusion 126 and the second BEI intrusion 128 may each be doped with one or more chemical species of boron, aluminum, and gallium. Conversely, if the first LDD region 122 and the second LDD region 124 are P− doped (e.g., doped with one or more P-type dopants), the first BEI intrusion 126 and the second BEI intrusion 128 may each be N− doped (e.g., doped with one or more N-type dopants). For example, the first BEI intrusion 126 and the second BEI intrusion 128 may each be doped with one or more chemical species of phosphorus, arsenic, antimony, and bismuth. The semiconductor substrate 110 may be configured to sequester the BEI intrusion device 100 in an array, with the STI structure 140. Although the STI structure 140 is depicted in FIG. 1B as having a non-vertical interface with the first LDD region 122, the disclosure is not so limited.

Figure 2:
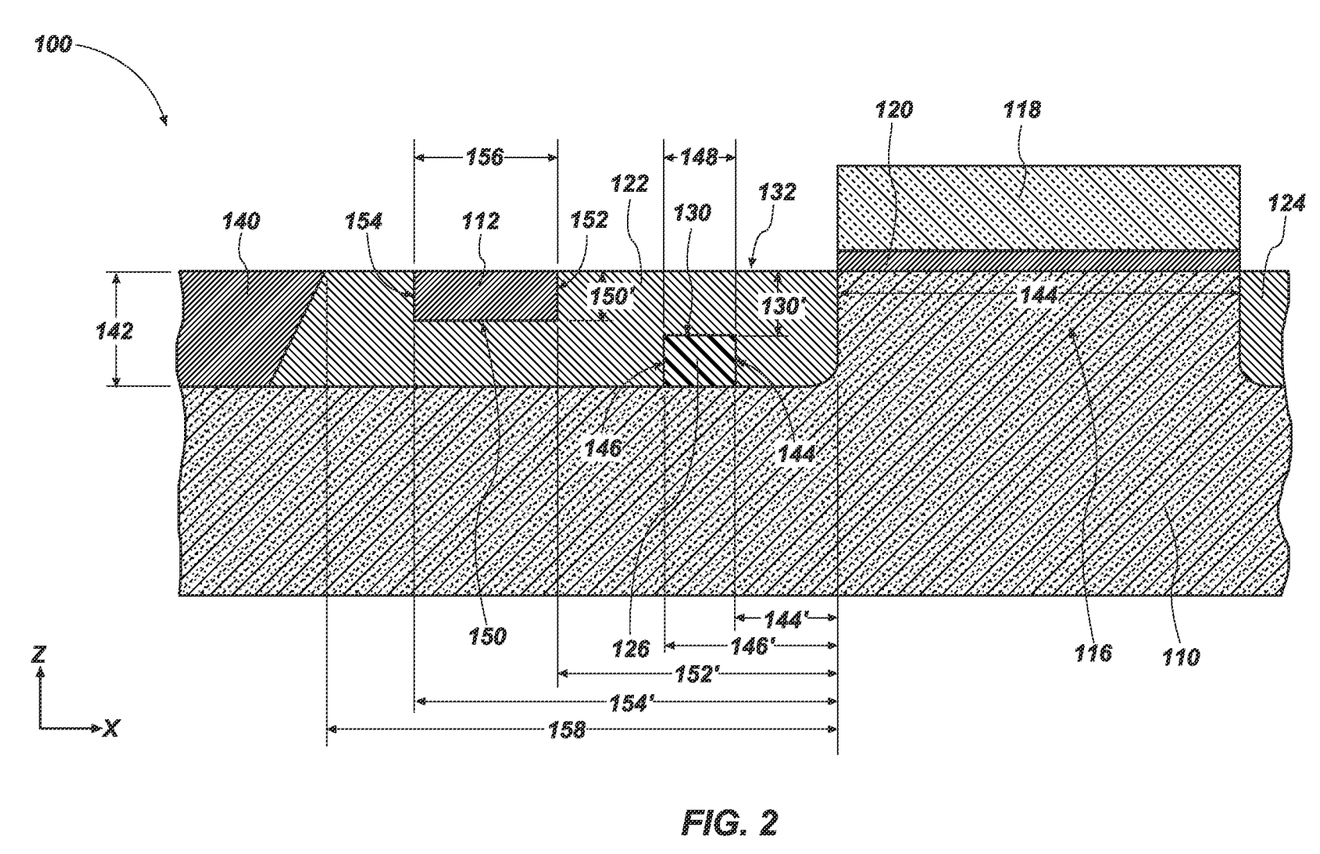
FIG. 2 is a detail section elevation view of the gated, lightly doped drain device, taken from FIG. 1B in accordance with embodiments of this disclosure.

FIG. 2 is a detail section elevation view of a portion of the BEI intrusion device 100 shown in FIG. 1B. The first LDD region 122 has a depth 142 that extends vertically downwardly into the semiconductor substrate 110. The first BEI intrusion 126 can be spatially described by relation to the channel region 116. The channel region 116 has a channel length bounded by the first LDD region 122 and the second LDD region 124. The first BEI intrusion 126 has an upper boundary 130 below the upper surface 132, and a lower boundary positioned at the depth 142 from the upper surface 132. In some embodiments, a lower boundary of the first LDD region 122 is also positioned at the depth 142 from the upper surface 132. In such embodiments, the upper boundary 130 of the first BEI intrusion 126 may overlie the lower boundary of the first BEI intrusion 126 by a height equal to between about 5% and about 95% of a magnitude of the depth 142. In an embodiment, the upper boundary 130 of the first BEI intrusion 126 overlies the lower boundary of the first BEI intrusion 126 by a height within a range from about 25% to about 55% of a magnitude of the depth 142. In an embodiment, the upper boundary 130 of the first BEI intrusion 126 overlies the lower boundary of the first BEI intrusion 126 by a height equal to about 40% of the magnitude of the depth 142, which means the upper boundary 130 has a depth 130' below the upper surface 132 equal to about 60% of the magnitude of the depth 142.

In additional embodiments, the lower boundary of the first BEI intrusion 126 is positioned below the depth 142 depicted FIG. 2. In such embodiments, the lower boundary of the first BEI intrusion 126 is positioned below the lower boundary of the first LDD region 122 (which is positioned at the depth 142). The first BEI intrusion 126 may vertically terminate within a portion of the semiconductor substrate 110 underlying the first LDD region 122. For example, the first BEI intrusion 126 may extend from the upper boundary 130 to a further depth up to about three times (3×) deeper within the semiconductor substrate 110, as measured from the upper surface 132, than the depth 142.

The first BEI intrusion 126 can be further spatially described by an inner lateral boundary 144 that is spaced apart from and proximal to the channel region 116, where the horizontal offset (e.g., in the X-direction) of the inner lateral boundary 144 from a lateral boundary of the channel region 116 is measured by a length 144'. The first BEI intrusion 126 can be further spatially described by an outer lateral boundary 146 that is spaced apart and distal from the channel region 116, where the horizontal offset (e.g., in the X-direction) of the outer lateral boundary 146 from the lateral boundary of the channel region 116 is measured by a length 146'. The first BEI intrusion 126 has a width 148 (e.g., in the X-direction). The first BEI intrusion 126 has a lateral form factor spaced apart both from the channel region 116 and from the first S/D region 112.

Figure 2A:
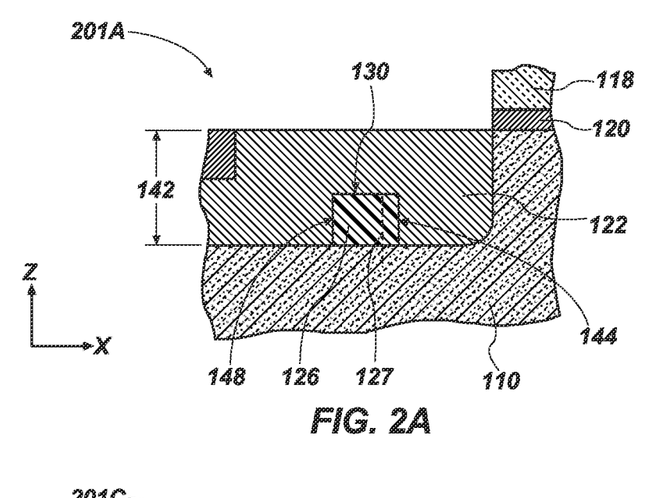
FIGS. 2A-2D are detail sections taken from FIG. 2 in accordance with embodiments of this disclosure.

FIG. 2A is a detail section 201A taken from FIG. 2, in accordance with embodiments of this disclosure. The first BEI intrusion 126 may have a substantially homogeneous dopant concentration profile 127 across a height of the first BEI intrusion 126, as measured from the upper boundary 130 to a lower boundary at or below the depth 142. As used herein, the term "homogeneous," with reference to a chemical species (e.g., dopant), means relative amounts of the chemical species included in a feature (e.g., a region, a material, a structure,) do not vary throughout different portions (e.g., different horizontal portions, different vertical portions) of the feature, within conventional quantitative and/or qualitative detection techniques as applied to structures in a microelectronic device.

In additional embodiments, the first BEI intrusion 126 has a heterogeneous dopant concentration profile across a height of the first BEI intrusion 126, as measured from the upper boundary 130 to a lower boundary at or below the depth 142. As used herein, the term "heterogeneous," with reference to a chemical species (e.g., dopant), means relative amounts of the chemical species included in a feature (e.g., a region, a material, a structure) vary throughout different portions of the feature. If a feature is heterogeneous, amounts of one or more chemical species included in the feature may vary stepwise (e.g., change abruptly), or may vary continuously (e.g., change progressively, such as linearly, parabolically) throughout different portions of the feature. Non-limiting examples of heterogeneous dopant concentration profiles suitable for the first BEI intrusion 126 are described in further detail below with reference to FIGS. 2B through 2D.

Figure 2B:
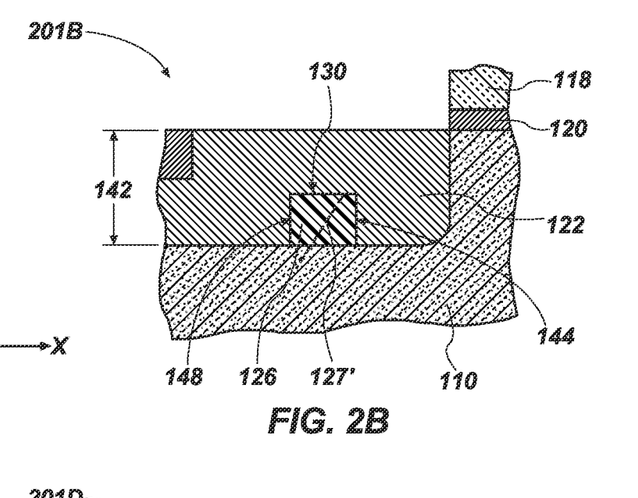

FIG. 2B is a detail section 201B taken from FIG. 2, in accordance with additional embodiments of this disclosure. The first BEI intrusion 126 may have a graded dopant concentration profile 127', as measured from the upper boundary 130 to a lower boundary at or below the depth 142. Dopant concentration may progressively diminish across the first BEI intrusion 126 in a direction extending from the upper boundary 130 toward the lower boundary at or below the depth 142. The dopant concentration may, for example, progressively diminish across a height of the first BEI intrusion 126 by a magnitude within a range of from about 5% to about 50% in a direction extending from the upper boundary 130 toward the lower boundary, such as by about 5%, by about 10%, by about 30%, or by about 50%.

Figure 2C:
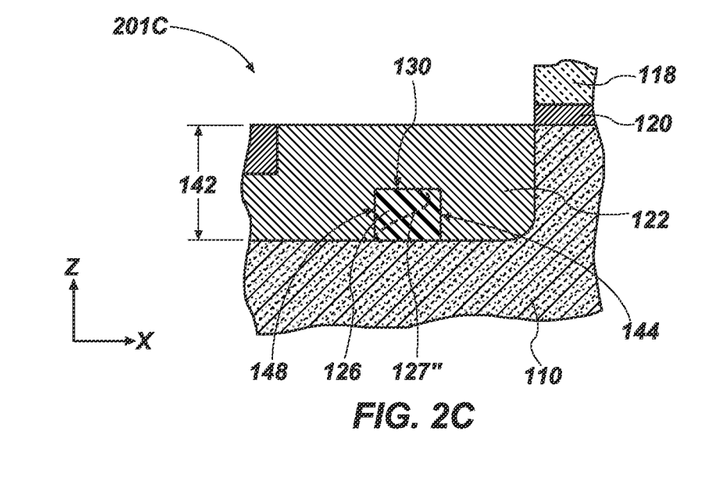

FIG. 2C is a detail section 201C taken from FIG. 2, in accordance with embodiments of this disclosure. The first BEI intrusion 126 may have a graded dopant concentration profile 127'', as measured from the upper boundary 130 to a lower boundary at or below the depth 142. The graded dopant concentration profile 127'' may be curvilinear (e.g., non-linear), wherein a dopant concentration is highest at or proximate to the upper boundary 130 and decreases in a non-linear manner in a direction heading toward the depth 142. The dopant concentration (e.g., P-type dopant concentration) across a height of the first BEI intrusion 126, including at or proximate the upper boundary 130 and at or proximate a lower boundary at or below the depth 142, may be higher than a dopant concentration (e.g., P-type dopant concentration) within portions of the semiconductor substrate 110 underlying the first BEI intrusion 126.

Figure 2D:
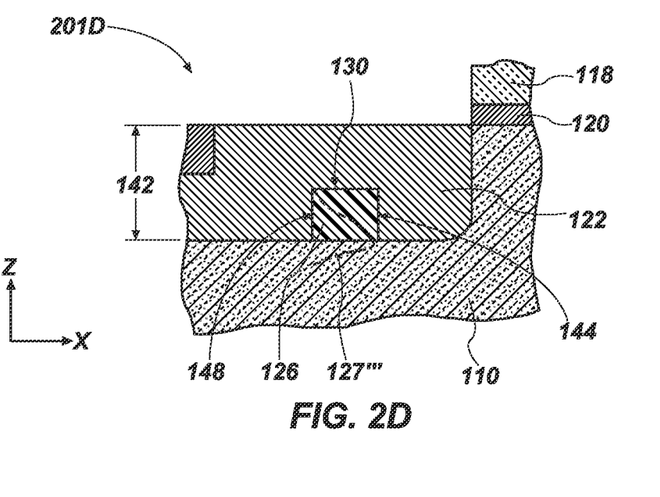

FIG. 2D is a detail section 201D taken from FIG. 2, in accordance with embodiments of this disclosure. The first BEI intrusion 126 may have a graded dopant concentration profile 127''', as measured from the upper boundary 130 to a lower boundary at or below the depth 142. The graded dopant concentration profile 127''' may be curvilinear (e.g., non-linear), wherein a dopant concentration is lowest at or proximate to the upper boundary 130 and increases in non-linear manner a direction heading toward the depth 142. The dopant concentration (e.g., P-type dopant concentration) across a height of the first BEI intrusion 126, including at or proximate the upper boundary 130 and at or proximate a lower boundary at or below the depth 142, may be higher than a dopant concentration (e.g., P-type dopant concentration) within portions of the semiconductor substrate 110 underlying the first BEI intrusion 126.

Referring again FIG. 2. The first S/D region 112 can be spatially described with respect to the first BEI intrusion 126 and with respect to the first LDD region 122. The first S/D region 112 has a lower boundary 150 that may be measured as a vertical depth 150' from the upper surface 132 of the semiconductor substrate 110. The first S/D region 112 can be further spatially described by an inner lateral boundary 152 that is spaced apart from and proximal to the channel region 116, where the horizontal offset (e.g., in the X-direction) of the inner lateral boundary 152 from a lateral boundary of the channel region 116 is measured by a length 152'. The first S/D region 112 can be further spatially described by an outer lateral boundary 154 spaced apart from and distal from the channel region 116, where the horizontal offset (e.g., in the X-direction) from the channel region 116 is measured by a length 154'. The first S/D region 112 has a width 156.

In an embodiment, the first BEI intrusion 126 is horizontally centered between a horizontal boundary of the channel region 116 and the inner lateral boundary 152 of the first S/D region 112. The length 144' between the inner lateral boundary 144 of the first BEI intrusion 126 and the horizontal boundary of the channel region 116 is substantially the same as a length between the outer lateral boundary 146 of the first BEI intrusion 126 and the inner lateral boundary 152 of the first S/D region 112.

The first LDD region 122 has a width 158 (e.g., in the X-direction) extending from a horizontal boundary (e.g., edge) of the channel region 116 to a horizontal boundary of the STI structure 140.

In some embodiments, the first BEI intrusion 126 vertically overlaps the first S/D region 112, such that the upper boundary 130 of the first BEI intrusion 126 is within vertical boundaries of the first S/D region 112. In an additional embodiment, the first BEI intrusion 126 does not vertically overlap the first S/D region 112, such that the upper boundary 130 of the first BEI intrusion 126 underlies the lower boundary 150 of the first S/D region 112.

Descriptions related to FIGS. 2 and 2A-2D with respect to the first features, e.g., the first BEI intrusion 126 in FIG. 2, may be mapped to the first features in FIG. 1. Similarly, descriptions in FIG. 1 with respect to second features, e.g., the second BEI intrusion 128, may be inferred to include corresponding configurational options that are disclosed for first features in FIGS. 2 and 2A-2D. For example, the second BEI intrusion 128 may have the respective inner and outer lateral boundary option descriptions 152 and 154 discussed in FIG. 2. Additionally for example, the second BEI intrusion 128 may have one of the dopant concentration profile option descriptions described in FIGS. 2A-2D. Similarly, for example, the second BEI intrusion 128 may have one of the dopant vertical termination embodiments within the semiconductor substrate, at or below the depth 142.

Figure 3:
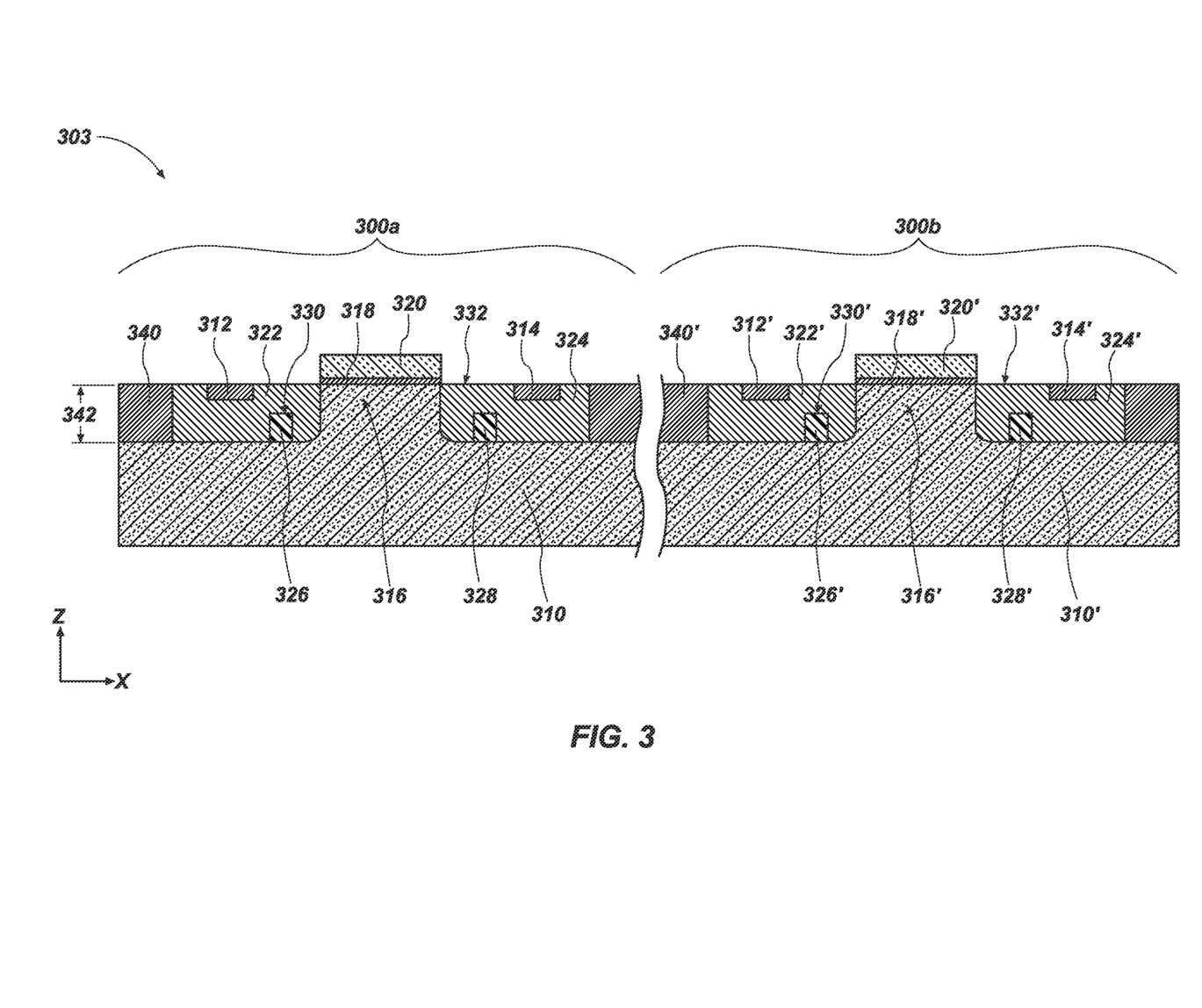
FIG. 3 is a simplified, partial cross-section elevation view of breakdown-enhancement implant intrusions in portions of an integrated-circuit apparatus in several gated, lightly doped drain devices in accordance with several embodiments of the disclosure.

FIG. 3 is a simplified, partial cross-section elevation view of BEI intrusions in portions of integrated-circuit apparatus 303 including several (e.g., multiple) BEI intrusion devices, in accordance with embodiments of the disclosure. The integrated-circuit apparatus 303 may include a first BEI intrusion device 300a and a second BEI intrusion device 300b. Throughout FIG. 3 and the associated description below, features (e.g., structures, materials, regions, devices) functionally similar to features previously described with reference to one or more of FIGS. 1A, 1B, 2, and 2A through 2D are referred to with similar reference numerals incremented by 100. To avoid repetition, not all features shown in one or more of FIGS. 1A, 1B, 2, and 2A through 2D are described in detail herein. Rather, unless described otherwise below, in FIG. 3, a feature designated by a reference numeral that is a 100 increment of the reference numeral of a feature previously described with reference to one or more of FIGS. 1A, 1B, 2, and 2A through 2D will be understood to be substantially similar to the previously described feature. In addition, as the first BEI intrusion device 300a may have a different configuration (e.g., one or more different materials, such as one or more different dopants; one or more different material distributions, such as one or more different dopant distributions) than the second BEI intrusion device 300b, features (e.g., regions, materials, structures) of the second BEI intrusion device 300b are distinguished from corresponding features of the first BEI intrusion device 300a by a prime (') designation.

In an embodiment, the first BEI intrusion device 300a and the second GLDD device 300b may individually include micro-sized and/or nano-sized critical dimensions. The first BEI intrusion device 300a and the second BEI intrusion device 300b are horizontally offset from one another within the integrated-circuit apparatus 303. In addition, the first BEI intrusion device 300a and the second BEI intrusion device 300b may be located at substantially the same vertical elevation as one another within the integrated-circuit apparatus 303.

In a first embodiment, the first BEI intrusion device 300a is a high-voltage N-doped metal-oxide-semiconductor (HV NMOS) device, and the second BEI intrusion device 300b is a high-voltage P-doped metal-oxide-semiconductor (HV PMOS) device.

In a second embodiment, the first BEI intrusion device 300a is a high-voltage P-doped metal-oxide-semiconductor (HVP) device, and the second BEI intrusion device 300b is also an HVP device.

In a third embodiment, the first BEI intrusion device 300a and the second BEI intrusion device 300b are both HV NMOS devices, but P-type doping characteristics (e.g., dopant concentrations, dopant distributions) within the first BEI intrusion 326 and the second BEI intrusion 328 of the first BEI intrusion device 300a are different than P-type doping characteristics (e.g., dopant concentrations, dopant distributions) within the first BEI intrusion 326' and the second BEI intrusion 328' of the second BEI intrusion device 300b. Accordingly, the first GLDD device 300a and the second GLDD device 300b may have different breakdown voltage (BV) characteristics than one another.

In a fourth embodiment, the first BEI intrusion device 300a is an HV NMOS device, and the second BEI intrusion device 300b is a low-voltage NMOS (LV NMOS) device. P-type doping characteristics (e.g., dopant concentrations, dopant distributions) within the first BEI intrusion 326 and the second BEI intrusion 328 of the first GLDD device 300a may be different than P-type doping characteristics (e.g., dopant concentrations, dopant distributions) within the first BEI intrusion 326' and the second BEI intrusion 328' of the second BEI intrusion device 300b. Accordingly, the first BEI intrusion device 300a and the second BEI intrusion device 300b may have different BV characteristics than one another.

In a fifth embodiment, the first BEI intrusion device 300a is an HV NMOS device including P-type dopant within the first BEI intrusion 326 and the second BEI intrusion 328 thereof; and the second BEI intrusion device 300b another HV NMOS device having dopant characteristics suitable for employing the second BEI intrusion device 300b as a string driver device. The second BEI intrusion device 300b may also include P-type dopant within the first BEI intrusion 326' and the second BEI intrusion 328' thereof, but the second BEI intrusion device 300b may utilize an additional LDD dopant implant in the first LDD region 322' and the second LDD region 324' thereof as compared to the first BEI intrusion device 300a.

In a sixth embodiment, first BEI intrusion device 300a is a HV PMOS device, and the second BEI intrusion device 300b is a low-voltage PMOS (LV PMOS) device. N-type doping characteristics (e.g., dopant concentrations, dopant distributions) within the first BEI intrusion 326 and the second BEI intrusion 328 of the first BEI intrusion device 300a may be different than N-type doping characteristics (e.g., dopant concentrations, dopant distributions) within the first BEI intrusion 326' and the second BEI intrusion 328' of the second BEI intrusion device 300b. Accordingly, the first BEI intrusion device 300a and the second BEI intrusion device 300b may have different BV characteristics than one another.

In a seventh embodiment, the first BEI intrusion device 300a is a HV PMOS device including N-type dopant within the first BEI intrusion 326 and the second BEI intrusion 328 thereof; and the second BEI intrusion device 300b another HV PMOS device having dopant characteristics suitable for employing the second BEI intrusion device 300b as a string driver device. The second BEI intrusion device 300b may also include N-type dopant within the first BEI intrusion 326' and the second BEI intrusion 328' thereof, but the second BEI intrusion device 300b may utilize an additional LDD dopant implant in the first LDD region 322' and the second LDD region 324' thereof as compared to the first BEI intrusion device 300a.

Dimensions and relative positions of features (e.g., regions, materials, structures) of the first BEI intrusion device 300a may be substantially the same as dimensions and relative positions of corresponding features (e.g., regions, materials, structures) of the second BEI intrusion device 300b. As a non-limiting example, dimensions and relative positions of the first BEI intrusion 326 and the second BEI intrusion 328 of the first BEI intrusion device 300a may be substantially the same as dimensions and relative positions of the first BEI intrusion 326' and the second BEI intrusion 328' of the second BEI intrusion device 300b. In additional embodiments, dimensions and/or relative positions of one or more features of the first BEI intrusion device 300a are different than dimensions and/or relative positions of one or more corresponding features of the second BEI intrusion device 300b.

Any of the dopant concentration profiles for the first BEI intrusion 126 previously described herein with reference to FIGS. 2A through 2B may be employed within the first BEI intrusion 326 and the second BEI intrusion 328 of the first BEI intrusion device 300a. In addition, any of the dopant concentration profiles for the first BEI intrusion 126 previously described herein with reference to FIGS. 2A through 2B may be employed within the first BEI intrusion 326' and the second BEI intrusion 328' of the second BEI intrusion device 300b. The dopant concentration profiles of the first BEI intrusion 326 and the second BEI intrusion 328 of the first BEI intrusion device 300a may be substantially the same as the dopant concentration profiles of the first BEI intrusion 326' and the second BEI intrusion 328' of the second BEI intrusion device 300b. The dopant concentration profiles of the first BEI intrusion 326 and the second BEI intrusion 328 of the first BEI intrusion device 300a may be substantially different than the dopant concentration profiles of the first BEI intrusion 326' and the second BEI intrusion 328' of the second BEI intrusion device 300b.

Figure 4:
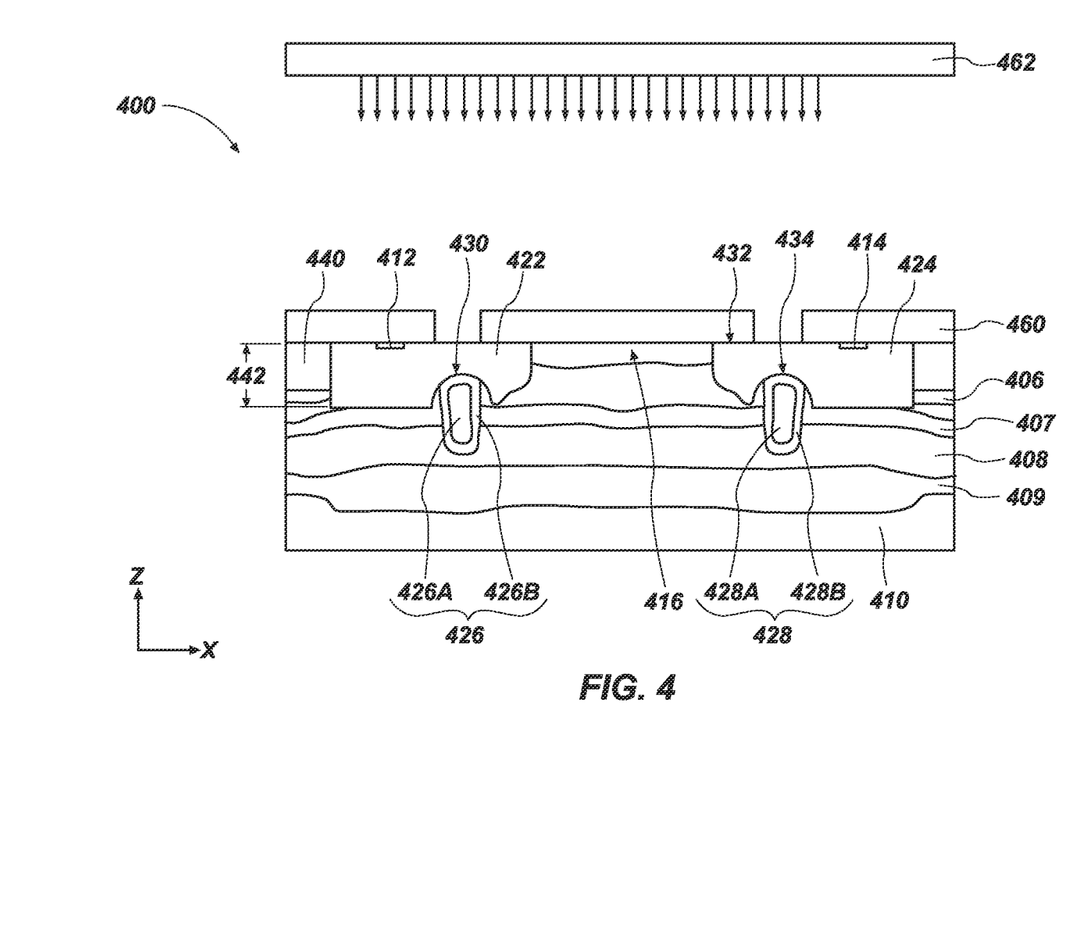
FIG. 4 is a simplified, partial cross-section elevation view of breakdown-enhancement implant intrusions in a gated lightly doped drain device in a portion of an integrated-circuit apparatus during fabrication according to several embodiments.

FIG. 4 is a simplified, partial cross-section elevation view of breakdown-enhancement implant intrusions in a BEI intrusion device 400 within a processing stage of a method of forming an integrated-circuit apparatus of the disclosure, in accordance with embodiments of the disclosure. Throughout FIG. 4 and the associated description below, features (e.g., structures, materials, regions, devices) functionally similar to features previously described with reference to one or more of FIGS. 1A, 1B, 2, 2A through 2D, and 3 are referred to with similar reference numerals incremented by 100. To avoid repetition, not all features shown in one or more of FIGS. 1A, 1B, 2, 2A through 2D, and 3 are described in detail herein. Rather, unless described otherwise below, in FIG. 4, a feature designated by a reference numeral that is a 100 increment of the reference numeral of a feature previously described with reference to one or more of FIGS. 1A, 1B, 2, 2A through 2D, and 3 will be understood to be substantially similar to the previously described feature.

As shown in FIG. 4, the semiconductor substrate 410 may have at least one additional doping region therein. By way of non-limiting example, the semiconductor substrate 410 may be formed to include one of more of a first additional doping region 406, a second additional doping region 407, a third additional doping region 408 and a fourth additional doping region 409. Further additional doping regions may be included within the semiconductor substrate 410, as desired. The different additional doping regions (e.g., the first additional doping region 406, the second additional doping region 407, the third additional doping region 408 and the fourth additional doping region 409) may have one or more of different dopants, different dopant concentrations, and different dopant distributions than one another. In some embodiments, each of the different additional doping regions of the semiconductor substrate 410 are P-doped, but at least two of the additional doping regions have different concentration and/or different distributions of P-type dopant than one another. Additionally, the first LDD region 422 and the second LDD region 424 within the semiconductor substrate 410 may individually have non-uniform dopant concentration profiles across the vertical heights thereof. In some embodiments, the first LDD region 422 and the second LDD region 424 are each doped such that relatively lower resistivity is facilitated relatively more proximate to the upper surface 432 of the semiconductor substrate 410, and a relatively highest resistivity is facilitated relatively more distal from the upper surface 432 of the semiconductor substrate 410 at or approaching the depth 442 of the first LDD region 422 and the second LDD region 424.

During fabrication, a mask material may be formed on or over the upper surface 432, and may be patterned to form a mask 460 (e.g., a hard mask). Openings with the mask 460 may expose portions of the first LDD region 422 and the second LDD region 424 for the formation of the first BEI intrusion 426 and the second BEI intrusion 428. Following the formation of the mask 460, one or more dopants (e.g., N-type dopant, P-type dopant) may be directed from a dopant source 462 and may be implanted into the exposed portions of the first LDD region 422 and the second LDD region 424 to form the first BEI intrusion 426 and the second BEI intrusion 428. As a non-limiting example, one or more boron-containing species (e.g., boron atoms, boron-containing molecules, boron ions, boron-containing ions) may be implanted into the first LDD region 422, the second LDD region 424, and regions of the semiconductor substrate 410 thereunder to form the first BEI intrusion 426 and the second BEI intrusion 428. As illustrated, the first BEI intrusion 426 and the second BEI intrusion 428 may be formed to extend into one or more of the additional doping regions (e.g., the first additional doping region 406, the second additional doping region 407, the third additional doping region 408 and the fourth additional doping region 408409) of the semiconductor substrate 410. Following the formation of the first BEI intrusion 426 and the second BEI intrusion 428, the mask 460 may be removed.

The first BEI intrusion 426 may include a first region 426A and a second region 426B; and the second BEI intrusion 428 may include a first region 428A and a second region 428B. The first region 426A of the first BEI intrusion 426 may be surrounded by the second region 426B of the first BEI intrusion 426. The first region 426A of the first BEI intrusion 426 may have a different dopant concentration (e.g., greater dopant concentration, lower dopant concentration) than the second region 426B of the first BEI intrusion 426. In addition, the first region 428A of the second BEI intrusion 428 may be surrounded by the second region 428B of the second BEI intrusion 428. The first region 428A of the second BEI intrusion 428 may have a different dopant concentration (e.g., greater dopant concentration, lower dopant concentration) than the second region 428B of the second BEI intrusion 428. In an embodiment, the first region 426A of the first BEI intrusion 426 has a greater dopant concentration as compared to the second region 426B of the first BEI intrusion 426A; and the first region 428A of the second BEI intrusion 428 has a greater dopant concentration as compared to the second region 428B of the second BEI intrusion 428. In an additional embodiment, the first region 426A of the first BEI intrusion 426 has a lower dopant concentration as compared to the second region 426B of the first BEI intrusion 426A; and the first region 428A of the second BEI intrusion 428 has a lower dopant concentration as compared to the second region 428B of the second BEI intrusion 428.

Figure 5:
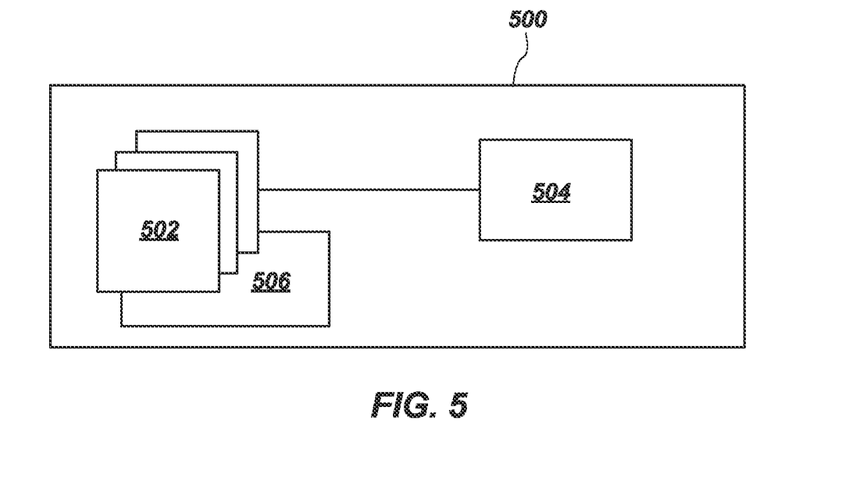
FIG. 5 is a schematic and functional block diagram of a memory device, according to embodiments of the disclosure.

FIG. 5 is a schematic and functional block diagram of a memory device 500, in accordance with embodiments of the disclosure. The memory device 500 (e.g., a non-volatile memory device, such as a 3D NAND Flash memory device; a volatile memory device, such as a dynamic random access memory (DRAM) device) may employ one or more of gated lightly doped drain, breakdown-voltage altered devices of the disclosure previously described herein with reference to FIGS. 1, 2, 2A through 2D, and 3. The one or more BEI intrusion devices of the memory device 500 may, for example, be formed using processing acts corresponding to those previously described herein with reference to FIG. 4. As shown in FIG. 5, the memory device 500 includes memory arrays 502, and one or more control logic units 504 operatively associated with the memory arrays 502. The memory arrays 502 may individually include memory cells, wherein one or more of the memory cells are operatively associated with one or more of the BEI intrusion devices of the disclosure previously described herein. A control logic unit 504 may be configured to operatively interact with the memory arrays 502, and may include at least one region including control logic circuitry (e.g., string driver circuitry). In some embodiments, the control logic circuitry includes complementary metal-oxide-semiconductor (CMOS) devices employing one or more of the BEI intrusion devices (e.g., HV NMOS devices) of the disclosure previously described herein. The memory arrays 502 and the control logic unit 504 may be operatively associated with various conductive routing structures (e.g., access line structure, data line structures, source line structures) to facilitate operations on the memory cells of the memory arrays 502. In some embodiments, CMOS devices of the control logic unit 504 at least partially vertically underlie and are positioned within horizontal areas of the memory arrays 502, such that the memory device 500 exhibits a so-called CMOS-under-array ("CuA") configuration 506.

Figure 6:
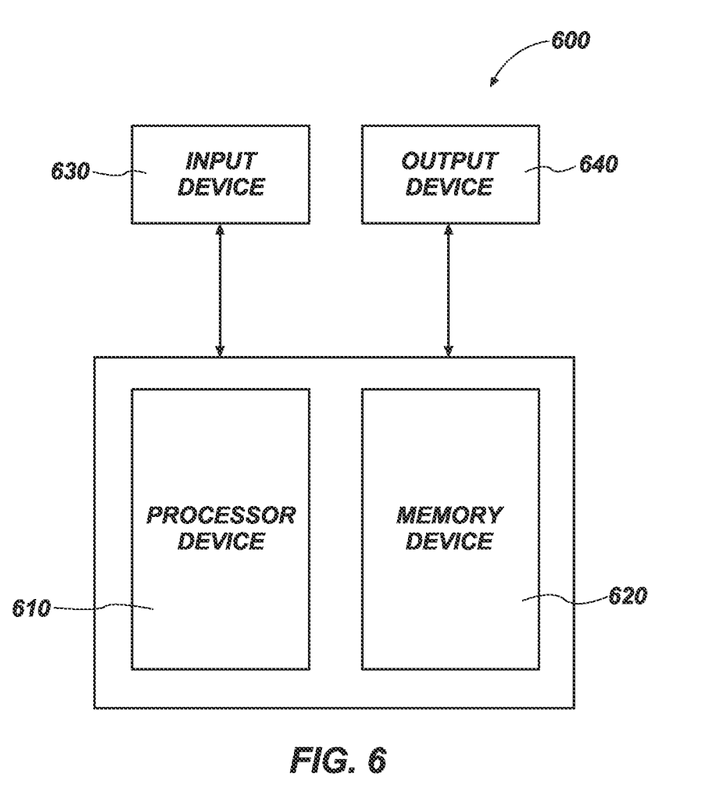
FIG. 6 is a block diagram of an illustrative electronic system, according to embodiments of this disclosure.

Integrated-circuit apparatus of the disclosure may be used in embodiments of electronic systems of the disclosure. For example, FIG. 6 is a block diagram of an illustrative electronic system 600, according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 600 includes at least one memory device 620. The memory device 620 may include, for example, an embodiment of a BEI intrusion device (e.g., one or more of the BEI intrusion devices 100, 300a, 300b and 303) and/or a memory device (e.g., the memory device 500) previously described herein. The electronic system 600 may further include at least one electronic signal processor device 610 (often referred to as a "microprocessor"). The electronic signal processor device 610 may, optionally, include an embodiment of a BEI intrusion device (e.g., one or more of the BEI intrusion devices 100 and 303) and/or a memory device (e.g., the memory device 500) previously described herein. While the memory device 620 and the electronic signal processor device 610 are depicted as two (2) separate devices in FIG. 6, in additional embodiments, a single (e.g., only one) memory/processor device having the functionalities of the memory device 620 and the electronic signal processor device 610 is included in the electronic system 600. In such embodiments, the memory/processor device may include an embodiment of a BEI intrusion device (e.g., one or more of the BEI intrusion devices 100 and 303) and/or a memory device (e.g., the memory device 500) previously described herein. The electronic system 600 may further include one or more input devices 630 for inputting information into the electronic system 600 by a user, such as, for example, a mouse or other pointing device, a keyboard, a touchpad, a button, or a control panel. The electronic system 600 may further include one or more output devices 640 for outputting information (e.g., visual or audio output) to a user such as, for example, a monitor, a display, a printer, an audio output jack, and/or a speaker. In some embodiments, the input device 630 and the output device 640 may comprise a single touchscreen device that can be used both to input information to the electronic system 600 and to output visual information to a user. The input device 630 and the output device 640 may communicate electrically with one or more of the memory device 620 and the electronic signal processor device 610.

Thus, in accordance with embodiments of the disclosure, an apparatus includes lightly doped drain (LDD) regions vertically extending into a semiconductor substrate, a channel region horizontally interposed between the LDD regions, and source/drain (S/D) regions that vertically extend into the LDD regions. Breakdown-enhancement implant (BEI) regions are within the LDD regions and are horizontally interposed between the channel region and the S/D regions. The BEI intrusion regions have a different chemical species than the LDD regions, and the BEI intrusion regions have upper boundaries that vertically intrude into the LDD regions but that are underlying upper boundaries of the LDD regions. The apparatus also has a gate structure vertically overlying the channel regions and it is horizontally interposed between the BEI intrusion regions. Memory devices, electronic systems, and methods of forming microelectronic devices are also described.

Also in accordance with embodiments of the disclosure, a breakdown-voltage altered apparatus, comprises a P-doped semiconductor substrate including an upper surface and N− lightly doped drain (LDD) regions within the P-doped semiconductor substrate. Upper boundaries of the N− LDD regions are substantially coplanar with the upper surface of the P-doped semiconductor substrate. Also, a channel region within the P-doped semiconductor substrate is horizontally interposed between the N− LDD regions, and N+ source/drain (S/D) regions are partially surrounded by the N− LDD regions with upper boundaries of the N− LDD regions that are substantially coplanar with the upper surface of the P-doped semiconductor substrate. Also, P-doped breakdown-enhancement implant (BEI) intrusions are horizontally interposed between the channel region and the N+ S/D regions, the P-doped BEI intrusions are partially surrounded by the N− LDD regions and have upper boundaries that are vertically underlying the upper surface of the P-doped semiconductor substrate. Also, a gate electrode vertically overlies and is horizontally aligned with the channel region, and a gate dielectric material vertically interposed between the channel region and the gate electrode.

Also in accordance with embodiments of the disclosure, methods include implanting a chemical species within lightly doped drain (LDD) regions extending into a semiconductor substrate to form breakdown-enhancement implant (BEI) regions within the LDD regions. The BEI intrusion regions have upper boundaries below an upper surface of the semiconductor substrate and the chemical species of the BEI intrusion regions have a different conductivity type than additional chemical species within LDD regions. Method embodiments also include forming a gate electrode over a channel region horizontally interposed the LDD regions.

Also in accordance with embodiment of the disclosure, an electronic system includes an input device, an output device and a processor device operably coupled to the input device and the output device. The electronic system also includes a memory device operably coupled to the processor device. The memory device includes a semiconductor substrate having an upper surface and lightly doped drain (LDD) regions extending into the semiconductor substrate from the upper surface. The memory device also includes a channel region interposed between the LDD regions and source/ drain (S/D) regions extending into the LDD regions from the upper surface of the semiconductor substrate. The memory device also includes breakdown-enhancement implant (BEI) regions within the LDD regions and interposed between the channel region and the S/D regions, where the BEI intrusion regions include a different dopant than the LDD regions and where the BEI intrusion regions have upper boundaries underlying the upper surface of the semiconductor substrate. The memory device also includes a gate electrode overlying the channel region and interposed between the BEI intrusion regions.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods, particularly by countering lowered breakdown voltages as a result of miniaturization.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
   lightly doped drain (LDD) regions vertically extending into a semiconductor substrate;
   a channel region horizontally interposed between the LDD regions;
   source/drain (S/D) regions vertically extending into the LDD regions;
   breakdown-enhancement implant (BEI) intrusion regions within the LDD regions and horizontally interposed between the channel region and the S/D regions, the BEI intrusion regions doped with a different chemical species than the LDD regions and having upper boundaries vertically underlying upper boundaries of the LDD regions; and
   a gate structure vertically overlying the channel region and horizontally interposed between the BEI intrusion regions.

2. The apparatus of claim 1, wherein the LDD regions are doped with N-type dopant and the BEI intrusion regions are doped with P-type dopant.

3. The apparatus of claim 1, wherein each of BEI intrusion regions is substantially horizontally centered between the channel region and one of the S/D regions.

4. The apparatus of claim 1, wherein the upper boundaries of BEI intrusion regions vertically underlie lower boundaries of the S/D regions.

5. The apparatus of claim 1, wherein BEI intrusion regions at least vertically extend to lower boundaries of the LDD regions.

6. The apparatus of claim 1, wherein the BEI intrusion regions partially extend into portions of the semiconductor substrate vertically underlying the LDD regions.

7. The apparatus of claim 1, wherein:
   the semiconductor substrate comprises a semiconductor material doped with P-type dopant;
   the LDD regions comprise the semiconductor material doped with N-type dopant;
   the S/D regions comprise the semiconductor material doped with an additional amount of the N-type dopant, the S/D regions having greater concentrations of the N-type dopant than the LDD regions; and
   the BEI intrusion regions comprises the semiconductor material doped with an additional amount of the P-type dopant, the BEI intrusion regions having greater concentrations of the P-type dopant than portions of the semiconductor substrate vertically thereunder.

8. The apparatus of claim 1, wherein:
   the semiconductor substrate comprises a semiconductor material doped with N-type dopant;
   the LDD regions comprise the semiconductor material doped with P-type dopant;
   the S/D regions comprise the semiconductor material doped with an additional amount of the P-type dopant, the S/D regions having greater concentrations of the P-type dopant than the LDD regions; and
   the BEI intrusion regions comprise the semiconductor material doped with an additional amount of the N-type dopant.

9. The apparatus of claim 1, wherein each of the BEI intrusion regions has a substantially homogeneous distribution of the chemical species.

10. The apparatus of claim 1, wherein each of the BEI intrusion regions has a heterogeneous distribution of the chemical species.

11. The apparatus of claim 1, wherein each of the BEI intrusion regions exhibit a nonlinear concentration profile of the chemical species extending between an upper boundary thereof to a lower boundary thereof.

12. The apparatus of claim 1, further comprising a gate dielectric between the gate structure and the channel region, the apparatus configured to operate at a voltage within a range of from about 15V to about 45V.

13. The apparatus of claim 1, further comprising a gate dielectric between the gate structure and the channel region, the apparatus configured to operate at a voltage within a range of from about 1V to about 5V.

14. An apparatus, comprising:
    a P-doped semiconductor substrate including an upper surface;
    N− lightly doped drain (LDD) regions within the P-doped semiconductor substrate, upper boundaries of the N− LDD regions substantially coplanar with the upper surface of the P-doped semiconductor substrate;
    a channel region within the P-doped semiconductor substrate and horizontally interposed between the N− LDD regions;
    N+ source/drain (S/D) regions partially surrounded by the N− LDD regions, upper boundaries of the N− LDD regions substantially coplanar with the upper surface of the P-doped semiconductor substrate;
    P-doped breakdown-enhancement implant (BEI) intrusions horizontally interposed between the channel region and the N+ S/D regions, the P-doped BEI intrusions partially surrounded by the N− LDD regions and having upper boundaries vertically underlying the upper surface of the P-doped semiconductor substrate;
    a gate electrode vertically overlying and horizontally aligned with the channel region; and
    a gate dielectric material vertically interposed between the channel region and the gate electrode.

15. The apparatus of claim 14, wherein the P-doped BEI intrusions vertically extend into the P-doped semiconductor substrate, a concentration of P-type dopant within the P-doped BEI intrusions greater than a concentration of the P-type dopant within the P-doped semiconductor substrate.

16. The apparatus of claim 14, wherein the upper boundaries of the BEI intrusions within boundaries of the LDD regions, are within a range of from about 5% of vertical heights of the LDD regions to about 95% of the vertical heights of the LDD regions.

17. The apparatus of claim 14, wherein a distribution of P-type dopant within portions of the P-doped semiconductor substrate underlying the LDD regions is heterogeneous.

18. An electronic system, comprising:
- an input device;
- an output device;
- a processor device operably coupled to the input device and the output device; and
- a memory device operably coupled to the processor device and comprising:
  - semiconductor substrate having an upper surface;
  - lightly doped drain (LDD) regions extending into the semiconductor substrate from the upper surface;
  - a channel region interposed between the LDD regions;
  - source/drain (S/D) regions extending into the LDD regions from the upper surface of the semiconductor substrate;
  - breakdown-enhancement implant (BEI) intrusion regions within the LDD regions and interposed between the channel region and the S/D regions, the BEI intrusion regions comprising a different dopant than the LDD regions and having upper boundaries underlying the upper surface of the semiconductor substrate; and
  - a gate electrode overlying the channel region and interposed between the BEI intrusion regions.

* * * * *

UNITED STATES PATENT AND TRADEMARK OFFICE
CERTIFICATE OF CORRECTION

PATENT NO. : 12,080,756 B2
APPLICATION NO. : 17/647912
DATED : September 3, 2024
INVENTOR(S) : Gaurav Musalgaonkar et al.

Page 1 of 1

It is certified that error appears in the above-identified patent and that said Letters Patent is hereby corrected as shown below:

In the Specification
Column 14,   Line 13,   change "region 408409) of" to --region 409) of--

Signed and Sealed this
Twenty-sixth Day of November, 2024

Katherine Kelly Vidal
*Director of the United States Patent and Trademark Office*